(12) United States Patent
Kinsman et al.

(10) Patent No.: US 7,600,314 B2
(45) Date of Patent: Oct. 13, 2009

(54) METHODS FOR INSTALLING A PLURALITY OF CIRCUIT DEVICES

(75) Inventors: Larry Kinsman, Boise, ID (US); Mike Brooks, Caldwell, ID (US); Warren M. Farnworth, Nampa, ID (US); Walter Moden, Meridian, ID (US); Terry Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 377 days.

(21) Appl. No.: 11/218,995

(22) Filed: Sep. 1, 2005

(65) Prior Publication Data

US 2006/0048382 A1 Mar. 9, 2006

Related U.S. Application Data

(60) Division of application No. 10/747,333, filed on Dec. 29, 2003, now Pat. No. 7,065,868, which is a continuation of application No. 09/258,764, filed on Feb. 26, 1999, now Pat. No. 6,681,480.

(51) Int. Cl.
*H01R 9/00* (2006.01)
*H05K 3/00* (2006.01)

(52) U.S. Cl. .............................. 29/845; 29/740; 29/741; 29/743; 29/747; 29/832; 29/833

(58) Field of Classification Search .................... 29/845, 29/740, 741, 743, 747, 832, 833, 593, 854; 294/15, 64.1
See application file for complete search history.

(56) References Cited

U.S. PATENT DOCUMENTS

| | | | |
|---|---|---|---|
| 3,867,753 A | 2/1975 | Urban, II et al. ............... | 29/764 |
| 4,109,379 A | 8/1978 | Ratti et al. ..................... | 29/747 |
| 4,223,934 A | 9/1980 | Cauceglia et al. ............. | 294/15 |
| 4,261,464 A | 4/1981 | Maitland ..................... | 206/334 |
| 4,291,819 A | 9/1981 | Heller et al. ................. | 221/298 |
| 4,377,907 A | 3/1983 | Bertellotti et al. ............. | 29/747 |
| 4,423,827 A | 1/1984 | Guigan ........................ | 221/129 |
| 4,441,140 A | 4/1984 | Richard ....................... | 361/720 |
| 4,460,108 A | 7/1984 | Noda et al. ................... | 221/94 |
| 4,527,222 A | 7/1985 | Swingley, Jr. ............... | 361/797 |
| 4,560,216 A | 12/1985 | Egawa | |
| 4,746,015 A | 5/1988 | Kaucic | |
| 4,855,809 A | 8/1989 | Malhi et al. ................... | 357/75 |
| 4,951,176 A | 8/1990 | Bergfried et al. ............ | 361/760 |
| 5,100,332 A | 3/1992 | Egawa | |

(Continued)

*Primary Examiner*—Thiem Phan
(74) *Attorney, Agent, or Firm*—Fletcher Yoder

(57) ABSTRACT

A technique is provided for installing circuit components, such as memory devices, in a support, such as a socket. The device to be installed is supported in a holder or shell. The holder is positioned over a support region in the receiving socket. A manual actuator is pressed into the holder to eject the device from the holder and to install the device in the support. The holder may be configured to hold a single device, or multiple devices aligned in slots defined by partitions. A multi-device tray may be provided for indexing devices toward an ejection slot, through which the devices are installed by manual actuation of an ejecting actuator. The technique provides protection for the device prior to and during installation, and facilitates manual installation of such devices without requiring direct hand contact with the device either prior to or during installation.

7 Claims, 5 Drawing Sheets

U.S. PATENT DOCUMENTS

| | | | |
|---|---|---|---|
| 5,104,324 A | 4/1992 | Grabbe et al. | 439/62 |
| 5,115,545 A | 5/1992 | Fujimoto et al. | 29/25.01 |
| 5,499,443 A * | 3/1996 | Ota et al. | 29/741 |
| 5,593,927 A | 1/1997 | Farnworth et al. | 437/209 |
| 5,807,066 A * | 9/1998 | Smith | 414/802 |
| 5,828,224 A | 10/1998 | Maruyama | |
| 5,879,175 A | 3/1999 | Muramatsu et al. | 439/159 |
| 6,374,484 B1 * | 4/2002 | Yoshida et al. | 29/740 |
| 6,681,480 B1 | 1/2004 | Kinsman et al. | |
| 7,065,868 B2 | 6/2006 | Kinsman et al. | |

* cited by examiner

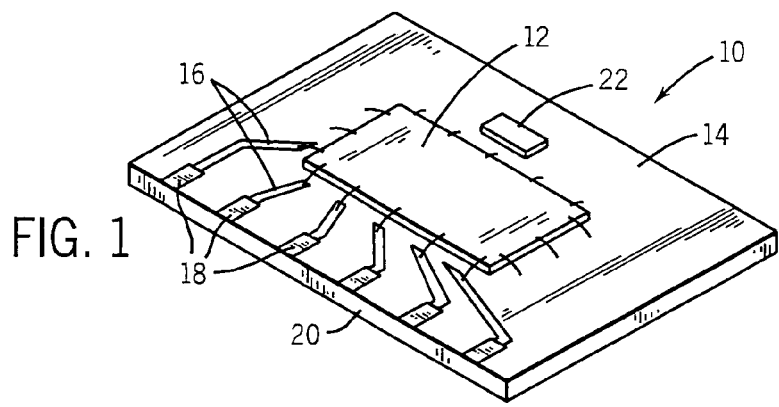
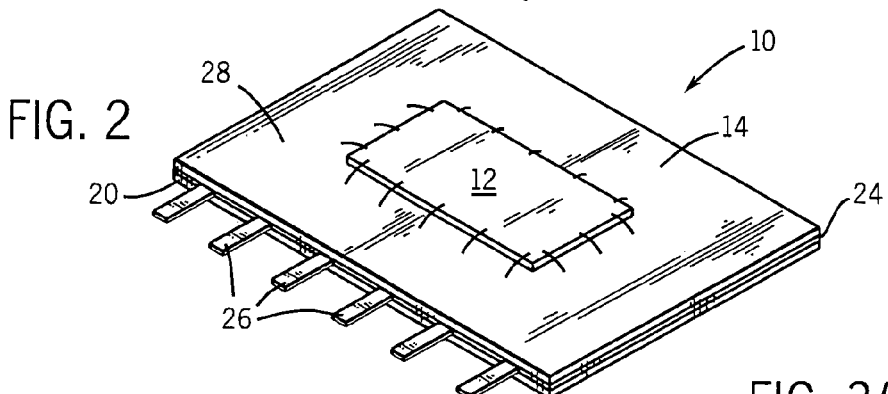
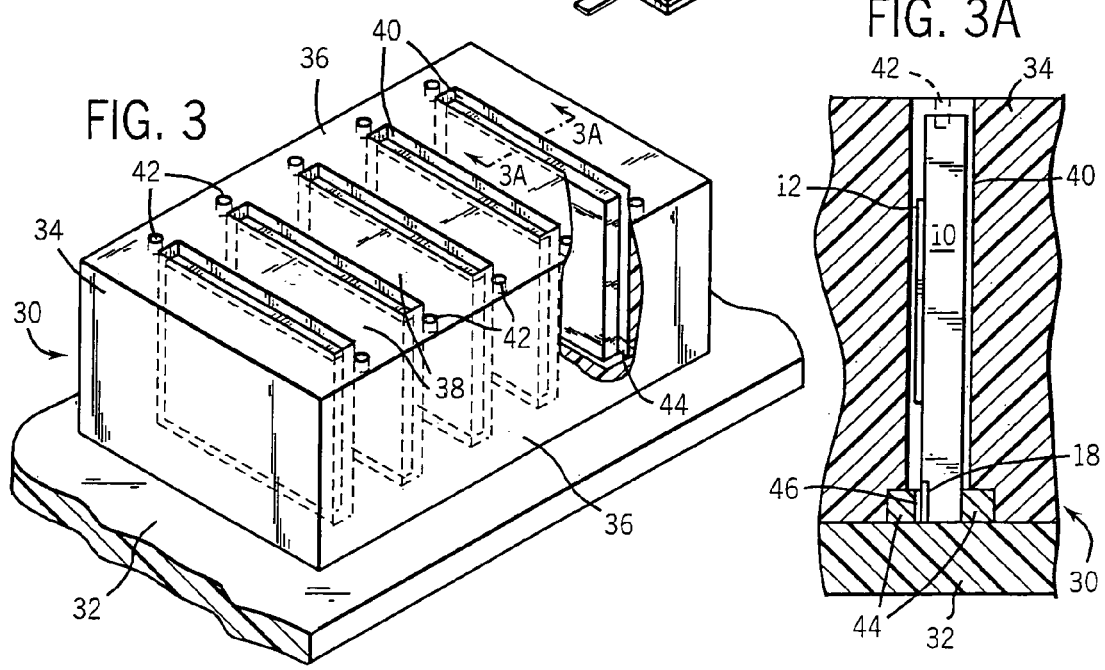

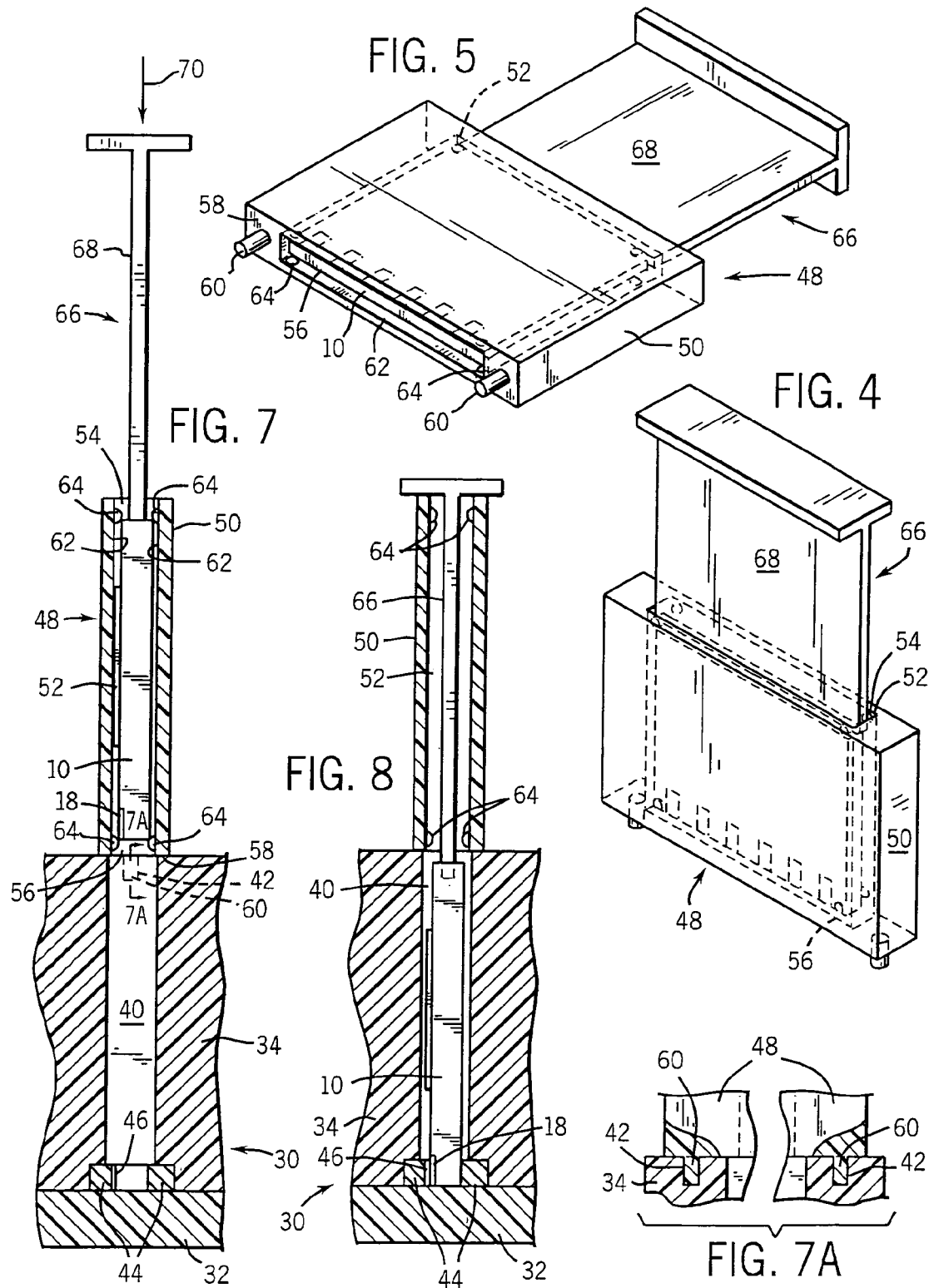

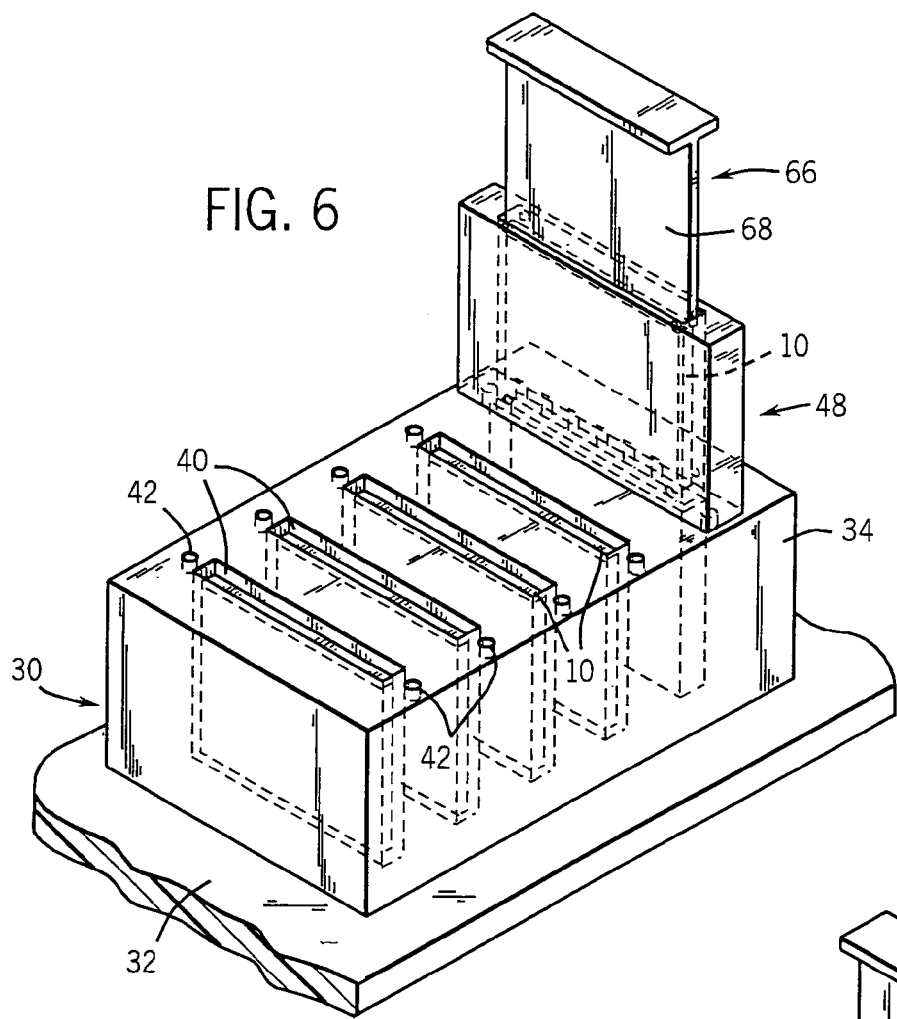
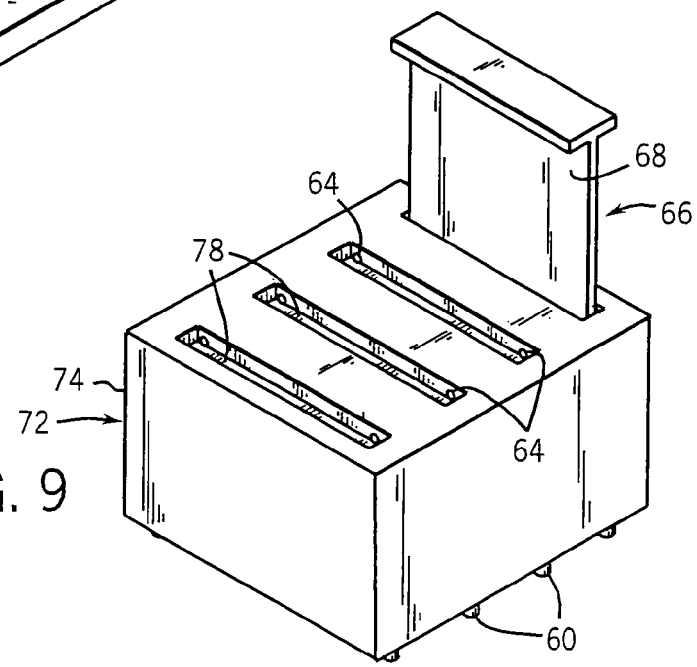

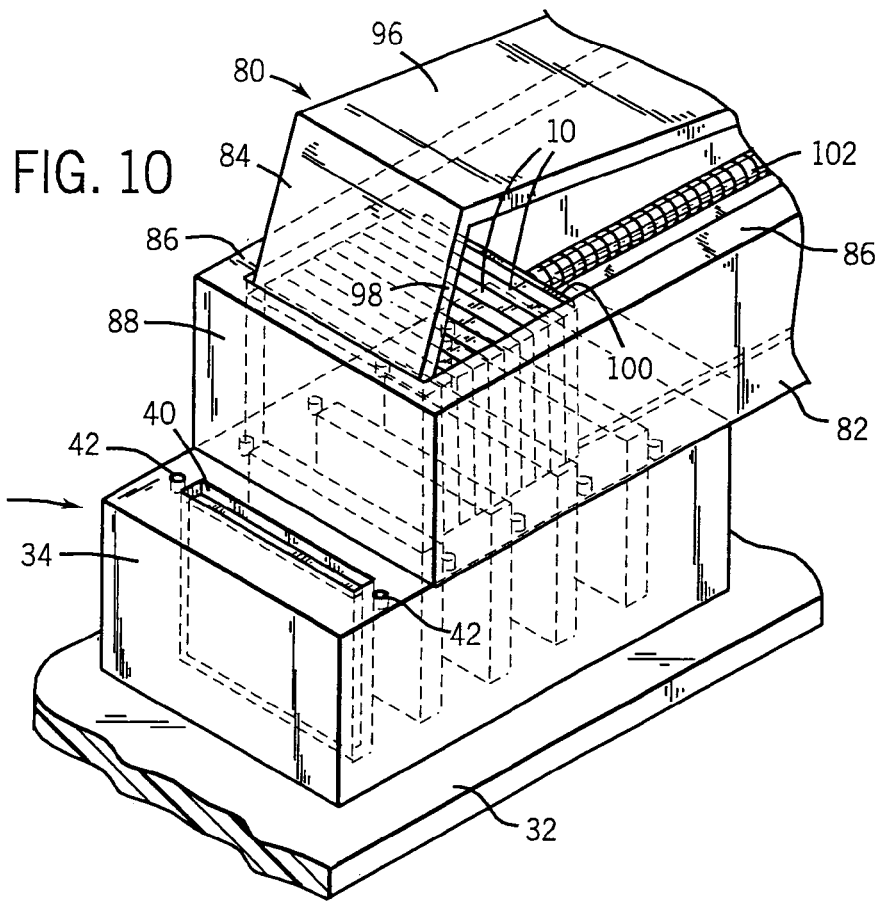
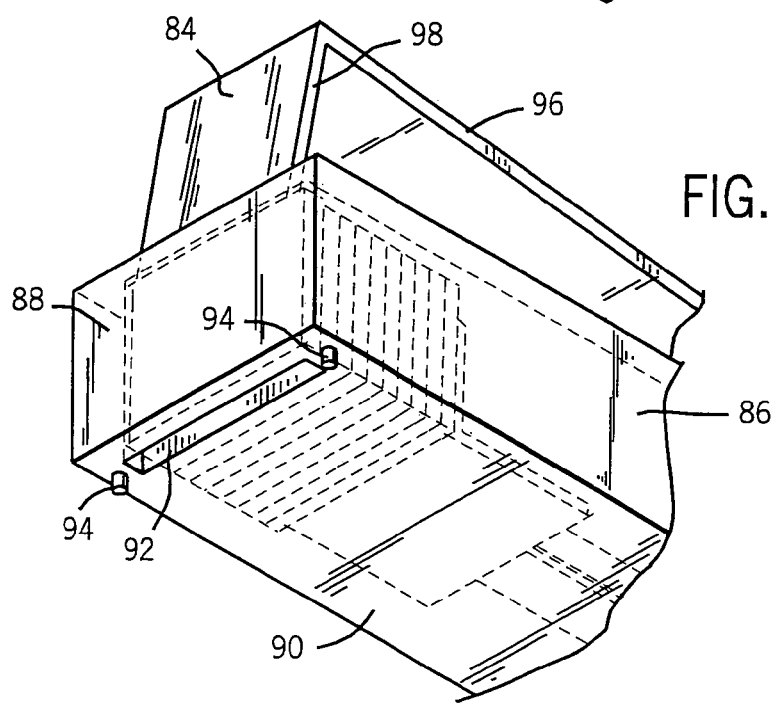

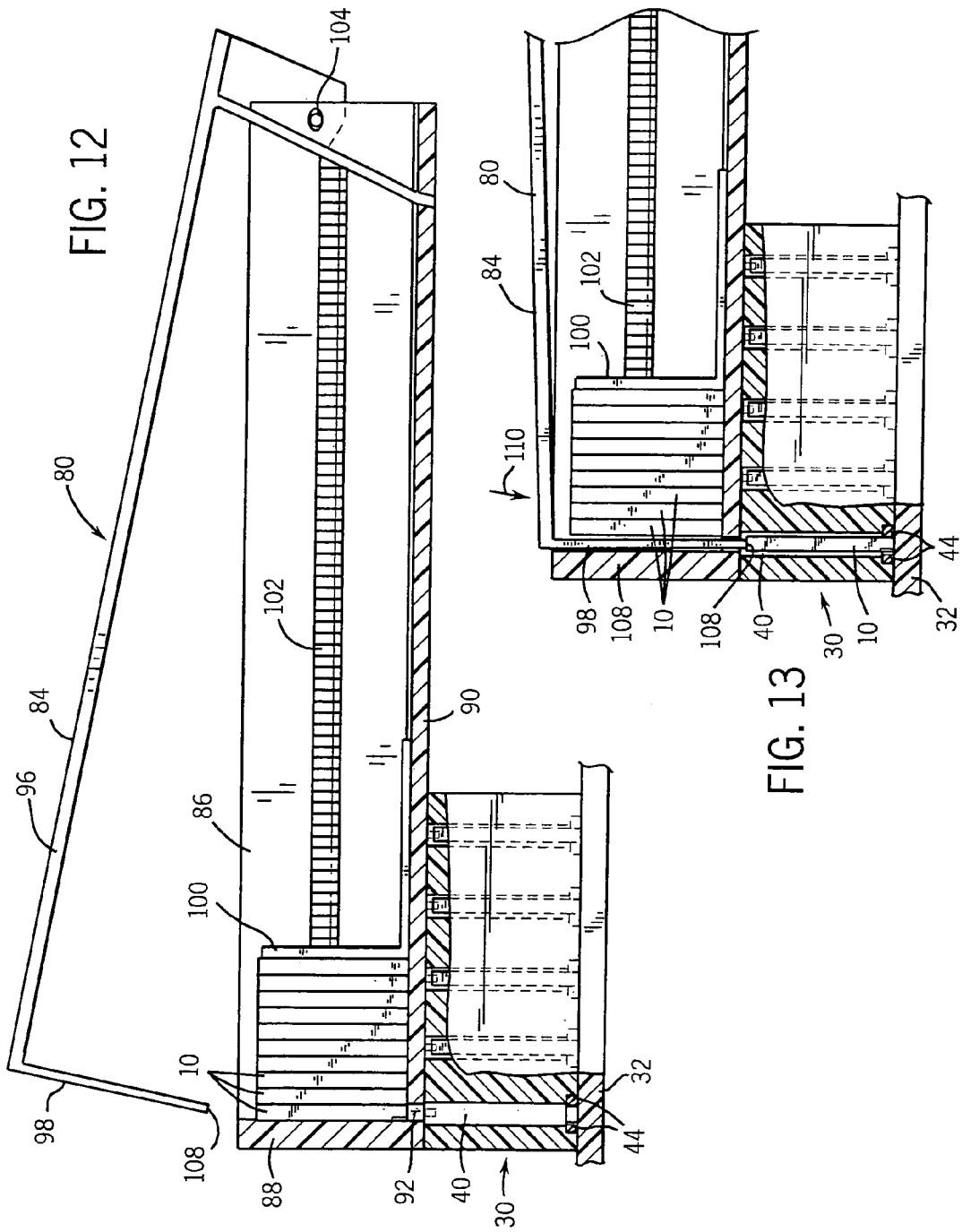

METHODS FOR INSTALLING A PLURALITY OF CIRCUIT DEVICES

CROSS-REFERENCE TO RELATED APPLICATIONS

The present application is a divisional of U.S. application Ser. No. 10/747,333, filed on Dec. 29, 2003, which is a continuation of U.S. application Ser. No. 09/258,764, filed on Feb. 26, 1999, now U.S. Pat. No. 6,681,480, issued on Jan. 27, 2004.

BACKGROUND OF THE INVENTION

1. Field of the Invention

The present invention relates to the installation and support of electronic circuits, such as field-installable memory circuits supported in individual packages such as dice, vertical surface mount packages, lead frame packages and so forth. More particularly, the invention relates to a technique for mechanically and electrically installing such circuit devices on a support, such as a socket or connector on a printed circuit board or motherboard.

2. Description of the Related Art

A wide variety of packaging techniques have been proposed and are currently in use for supporting and interconnecting electronic circuitry, such as memory devices, add-on peripheral circuits, upgrade circuit components, and so forth. Such devices typically include an electronic circuit or circuits formed in or disposed on a support, such as a semiconductor die. The electronic circuitry on the support is designed to function with external circuitry in the ultimate application, such as in a personal computer or other electronic device. To enhance the flexibility of the overall circuit design, it is particularly convenient to provide the separate electronic circuitry in packages which can be assembled on a supporting socket either during factory installation or in the field, such as by end users, local component vendors or service personnel. In such cases, the separately packaged circuitry may be designed to be retrofitted or installed on existing circuit boards as needed such as to further enhance or upgrade the user's system.

Individually packaged circuitry of the type mentioned above may be installed in several manners. For example, the installation of semiconductor dice may be automated in large scale manufacturing processes, particularly when the same or similar circuits are to be added to a large number of circuit boards. However, for after market or add-on circuits, such high-speed installation techniques are inappropriate. Rather, in such applications the circuit package is typically shipped and handled individually or in small groups. Vendors or end users often purchase the circuit packages and individually install the packages in the final application, such as by pressing conductive leads or pads provided on an edge of the package into corresponding sockets in a support or interface connector by hand or by means of conventional tools, such as tweezers.

Such techniques for installing circuit devices suffer from several important drawbacks. First and perhaps most importantly, the circuit device package itself may be quite fragile and easily damaged during handling and installation. Similarly, the circuit board and socket on which the package is installed may often be easily damaged when excessive or improperly-directed force is applied to it during installation. Moreover, increasingly complex add-on circuitry requires a large number of conductive pads or pins extending from the circuit package. These delicate features of the components stand a much greater risk of damage to either the circuit package or to the support in which the package is installed due, again, to excessive force and misalignment. In addition, where the circuits are manually handled and installed, serious damage to the circuits can result from static charges inadvertently conveyed to the circuits by the user or service personnel, or from oils present on the installer's hands.

Various approaches have been proposed and are currently in use for addressing the shortcomings of conventional circuit package installation techniques. For example, the packages supporting the add-on circuitry may be constructed in an increasingly robust manner in an attempt to provide a sturdy framework capable of withstanding handling during transport and installation. However, such packaging adds to the size and cost of the circuitry, and may not effectively reduce the risk of damage to the circuit on which the add-on package is installed. Moreover, to the extent that such techniques still require manual handling and installation, risks associated with static charges and oil from handling may be equally unavoidable.

There is a need, therefore, for an improved technique for handling and installing circuit devices that addresses such drawbacks. In particular, there is a need for an improved system for holding or supporting circuit devices, particularly fragile devices formed on unprotected semiconductor dice, or on dice with limited mechanical protection, during transport, handling and installation. Ideally the technique would reduce or eliminate the need to physically handle the circuit package itself, and would provide for appropriate alignment and securement of the circuit package in a socket or connector.

SUMMARY OF THE INVENTION

The present invention provides a technique for installing circuit devices which is designed to respond to these needs. The technique offers a system both for storing and transporting such devices, as well as for facilitating their installation in an application. The technique may be employed with a variety of device packages, but is particularly well suited to direct die connect sockets, lead frame packages, and the like. Moreover, the technique provides a mechanism for storing and installing a single such device, and which may be adapted for installation of a plurality of similar or different devices in a single unit.

In a favored approach, the technique employs a holder or case designed to enclose the circuit device during transport. The device holder also facilitates placement and alignment of the circuit device for installation. Moreover, the device holder permits ejection of the device for installation without requiring direct contact or handling by the user or service personnel. The technique may be further adapted to facilitate manual installation of a large number of similar devices, such as by vendors, from a tool which stores and ejects a series of similar devices from a stack. In its various embodiments, the technique may be employed with custom-designed component packages, or with packaged circuit devices of conventional design without requiring special adaptation of the external configuration of the packages.

Thus, in accordance with a first aspect of the invention, an apparatus is provided for installing an electronic circuit device on a support. The support includes a plurality of first conductive elements. The device has a plurality of second conductive elements disposed adjacent to at least one edge thereof The first conductive elements are configured to contact the second conductive elements when the device is installed on the support. The apparatus includes a holder and a manually actuatable ejector. The holder is configured to receive the device and to align the first conductive elements with the second conductive elements. The ejector is configured to extend at least partially into the holder and to urge the device into an installed position wherein the first conductive elements contact respective second conductive elements. The ejector may conveniently include a slot in which the device is aligned. The ejector enters into the slot to press the device from the slot and into engagement on the support upon manual actuation of the ejector. The holder may also conveniently include a plurality of such slots to facilitate transportation, storage and installation of a corresponding number of circuit devices.

In accordance with another aspect of the invention, a tool system is provided for installing a semiconductor device on a receiving support. The device includes a plurality of conductive elements disposed adjacent to an edge thereof. The conductive elements are received by an interface region of the support. The tool system comprises a holder and a manually operated ejector. The holder has side walls forming a cavity for retaining the device. An opening is provided from the cavity for dispensing the device on the support. The ejector is configured at least partially to enter into the cavity and to urge the device through the opening onto the interface region. A second opening may conveniently be provided in the slot for loading or charging the device prior to installation. Features may be provided on the holder which cooperate with registration features on the receiving support to ensure proper alignment of the device with the interface region prior to installation.

The ejector may be configured as an elongated tool which receives a stack or a series of semiconductor devices. The devices in the stack are urged toward a dispensing slot by a spring mechanism or similar arrangement. Upon actuation of the ejector, the device adjacent to the slot is forced through the slot for installation, followed by indexing of the next device in the stack toward the slot for installation.

The invention also provides a method for installing an electronic circuit device on a support. The circuit device is of the type having a plurality of first conductive elements configured to contact second conductive elements in an interface region of the support. In accordance with the method, the circuit device is positioned in a holder, the holder having a recess for receiving the circuit device. The holder is then positioned on the interface region. The circuit device is manually urged from the recess to electrically couple the first conductive elements to the second conductive elements, thereby installing the circuit device on the interface region of the support. The holder may conveniently guide the circuit device from the recess during its ejection therefrom. During the positioning of the holder on the interface region, registration elements disposed on the holder and the support may be mated to properly align the circuit device over the interface region.

In accordance with a variation on the method, a plurality of circuit devices are positioned in a dispenser. The dispenser is located on an interface region of a support. At least one of the circuit devices is then manually urged from the dispenser onto the interface region. First conductive elements on the circuit device thus dispensed are thereby brought into contact with second conductive elements of the support. The circuit devices positioned in the dispenser may be conveniently separated from one another by partitions formed in the dispenser or may be positioned in a stack directly contacting one another in the dispenser.

BRIEF DESCRIPTION OF THE DRAWINGS

The foregoing and other advantages and features of the invention will become apparent upon reading the following detailed description and upon reference to the drawings in which:

FIG. 1 is a perspective view of a circuit device having electrical contact pads along an edge for installation on a support, such as a printed circuit board socket;

FIG. 2 is a perspective view of an alternative package design for an electronic circuit device having conductive leads extending from a circuit support or substrate;

FIG. 3 is a perspective view of a support for securing circuit devices of the type illustrated in FIGS. 1 and 2 on a circuit board, with a portion of the support broken away to illustrate the arrangement of one of the circuit devices in the support;

FIG. 3A is a sectional view of a portion of the support illustrated in FIG. 3 along line 3A-3A, illustrating the manner in which the circuit device is held within the support;

FIG. 4 is a perspective view of a holder or dispenser for a circuit device of the type illustrated in FIG. 3 prior to installation;

FIG. 5 is a perspective view of the holder of FIG. 4 showing a slot from which the circuit device may be ejected, and alignment pins for properly aligning the circuit device over a support of the type shown in FIG. 3;

FIG. 6 is a perspective view of the holder of FIGS. 4 and 5 positioned over the support of FIG. 3 prior to installation of a circuit device therein;

FIG. 7 is a sectional view of the holder positioned as shown in FIG. 6 prior to installation of the circuit device;

FIG. 8 is a sectional view of the holder and support of FIG. 7 following installation of the circuit device into the support;

FIG. 9 is a perspective view of an alternative configuration of a holder wherein a plurality of circuit devices may be aligned for installation;

FIG. 10 is a perspective view of the portion of an alternative configuration of a holder and dispenser wherein a series or stack of circuit devices may be positioned for sequential installation into a socket or support;

FIG. 11 is a bottom perspective view of a portion of the device of FIG. 10, illustrating a slot through which the circuit devices may be ejected and features for properly aligning the device over a support;

FIG. 12 is a side sectional view of the dispenser of FIG. 10, illustrating an exemplary arrangement for continuously urging the circuit devices toward the ejection slot; and FIG. 13 is a sectional view of a portion of the dispenser of FIG. 12, shown in an actuated position for installation of a circuit device in a socket or support.

DETAILED DESCRIPTION OF SPECIFIC EMBODIMENTS

Turning now to the drawings, and referring first to FIG. 1, an electronic circuit device is illustrated and designated generally by the reference numeral 10. Device 10 includes a die 12 in which electronic circuits are formed by conventional processes. Die 12 is supported on a support or substrate 14, and is coupled to electrically conductive traces 16 on the substrate for transmitting power and data signals between circuitry formed in the die and external circuitry. Certain of the conductive traces 16 terminate in conductive pads 18 disposed along one or more edges 20 of substrate 14. In addition to die 12 and conductive traces 16, substrate 14 may include additional circuitry formed on or within a multi-layer structure, or supported on substrate 14. Thus, substrate 14 may include prepackaged surface components 22 designed to electrically interface with circuitry on or in the substrate itself or formed in die 12. Moreover, as will be appreciated by those skilled in the art, device 10 may include external packaging or enclosures designed to partially or completely cover die 12 or any surface components mounted thereon.

FIG. 2 illustrates an alternative configuration of an electronic device 10 which may also be mounted in accordance with the techniques described below. In the embodiment of FIG. 2, a die 12 is supported on a support or substrate 14. However, rather than the conductive pads or traces 18 of the embodiment of FIG. 1, the device illustrated in FIG. 2 includes one or more intermediate layers 24 formed in substrate 14 from which a plurality of conductive contact pins 26 extend. Pins 26 may extend from one or more edges of the device, or may originate in a face of the device rather than in the edge 20 as illustrated in FIG. 2. As will also be appreciated by those skilled in the art, while the embodiments of FIGS. 1 and 2 include a relatively small number of contact pads or pins for connecting circuitry of die 12 to external circuitry, in certain applications a large number of such contact elements may be provided, in one or more rows or in an array, or on both front and rear sides of a support or substrate, such as a laminated circuit board.

FIG. 3 illustrates an exemplary support for receiving an electronic device of the type illustrated in FIGS. 1 and 2 and for completing electrical connections between such devices and external circuitry. As shown in FIG. 3, support 30 is designed to be mounted on and electrically interfaced with an external circuit board such as a system board, mother board, and so forth as indicated at reference numeral 32. Board 32 will typically include conductive traces and circuit components designed to exchange signals with one or more electronic devices 10 mounted within support 30. For example, board 32 may include a mother board in a computer system, and device 10 a solid state memory device, such as a DRAM or other memory configuration.

Support 30 includes an insulative body 34 having side walls 36 and a series of partitions 38 defining sockets 40. Sockets 40 extend over the entire height of body 34 and are designed to receive and support devices 10, and to guide the devices into engagement with external circuitry as described more fully below. In the exemplary embodiment of FIG. 3, five such sockets are illustrated in body 34. However, depending upon the exigencies of particular applications, more or fewer such sockets may be provided. Moreover, while sockets 40 are illustrated in a generally parallel arrangement, other arrangements may be envisaged, such as a plurality of sockets arranged in rows or in a matrix. Each socket 40 includes features for facilitating proper registration of an insertion tool for installing electronic devices. In the illustrated embodiment, such registration features include a pair of registration recesses 42 adjacent to each socket 40. At the base of each socket 40, an electrical socket 44 is provided (see FIG. 3A). Electrical socket 44 includes a plurality of electrically conductive elements 46 designed to contact each of the conductive pads 18 (or pins 26) of device 10 upon proper installation of the device into support 30. In practice, conductive elements 46 will provide continuity to external circuitry supported on board 32 or on external boards or system components in a manner generally known in the art.

A presently preferred tool or dispenser for installing devices 10 in a support 30 of the type illustrated in FIG. 3 is shown in FIGS. 4 and 5. As illustrated in those figures, the dispenser 48 may be configured to support a single electronic device designed to be installed in a single socket of the support. The dispenser includes a case or shell 50 which is designed to receive and hold the electronic device and to protect the electronic device during transport and handling. Shell 50 forms a central slot or recess 52 extending completely therethrough and forming an upper opening 54 and a lower opening 56 (see FIG. 5). Device 10 may be inserted into slot 52 through either upper opening 54 or lower opening 56. A lower face 58 of shell 50 includes features for insuring proper alignment and registration of the dispenser for installation of a circuit device. In the illustrated embodiment, such features include a pair of registration pins 60 disposed at lateral positions adjacent to lower opening 56. Internal walls 62 of shell 50 surround slot 52 to contact and guide device 10 during translation therein, as described below, for installation. Moreover, retaining projections 64 are formed adjacent to upper and lower openings 54 and 56 to exert a slight retaining force on device 10 when inserted into slot 52 and thereby to prevent the device from sliding from the slot prematurely.

Dispenser 48 also includes an actuator 66 for urging device 10 into an installed position within support 30. In the illustrated embodiment, actuator 66 includes a panel 68 of slightly smaller dimensions than slot 52 such that panel 68 may be pressed into slot 52 to urge the device contained therein into the support.

Installation of a device 10 into a support 30 by means of a dispenser of the type shown in FIGS. 4 and 5 is illustrated in FIGS. 6, 7, 7A, and 8. As shown in FIGS. 6 and 7, the installation begins with placement of the dispenser in registration over a desired support socket 40. A device 10 is loaded within the dispenser and the actuator is placed over an upper end of the device as shown. It should be noted that in this position, device 10 is retained by projections 64 at the upper and lower ends of slot 52. In practice, device 10 may be prepackaged in shell 50, shipped with the shell, and field installed as illustrated in FIGS. 7 and 8. As shown in FIG. 7, in the illustrated embodiment registration of the device over a socket of body 34 is facilitated by engagement of registration pins 60 in registration recesses 42. Thereafter, actuator 68 is depressed against device 10 as indicated by arrow 70 in FIG. 7. The force exerted on actuator 66 is sufficient to overcome interference with lower retaining projections 64, and device 10 is thus guided into socket 40 as shown in FIG. 8. Upon full engagement of the device in the socket, conductive pads 18 (or other structures such as pins 26) come into full contact and electrical engagement with conductive elements 46 of the electrical socket 44 to complete connections between device 10 and external circuitry. Thereafter dispenser 48 may be removed from support 30 and, where desired, discarded. Alternatively, dispenser 48 may be made reusable, so as to receive and dispense subsequent devices installed within shell 50 as described above.

FIG. 9 represents an alternative embodiment for an exemplary dispenser, designated generally by the reference numeral 72. Dispenser 72 is formed as a multi-device holder having a body or shell 74 and a plurality of partitions 76 separating independent device-receiving slots 78. Slots 78 are designed to receive and retain circuit devices 10 by means of retaining features such as projections 64 of the type described above with respect to the embodiment of FIGS. 5 through 8. Similarly, alignment or registration features are preferably formed on holder 72, such as registration pins 60 provided adjacent to each slot 78. The multi-device dispenser of FIG. 9 may be utilized to hold, transport, and dispense a plurality of similar or different devices positioned within slots 78, such as by means of an actuator 66 of the type described above. It should be noted, however, that other device configurations may be provided in the plurality of slots within the holder of FIG. 9, particularly where different chip sets are desired to be installed in a single sequence of operations, and are conveniently transported and stored as a collection of components. For installation, the dispenser of FIG. 9 is positioned over a support, such as the support 30 illustrated in FIG. 6, and the individual devices are installed in appropriate locations in the support as described above for the individual device dispenser 48.

The present technique may also be adapted for installation of a plurality of electronic devices as illustrated particularly in FIGS. 10, 11, 12, and 13. In this alternative embodiment, a group dispenser 80 is designed to receive a number of electronic devices 10 in a holder or tray 82. The devices are aligned and retained in the tray and are advanced to an installation position for insertion into a retaining socket in a sequential manner. To urge the individual devices into the retaining and support socket, an actuator 84 is disposed adjacent to tray 82, and is displaceable with respect to the tray to urge the devices into their installed position. Accordingly, tray 82 includes sidewalls 86 and an endwall 88 for guiding and aligning devices 10 therein. A base 90 (see FIG. 11) serves as a support for the devices as they are translated sequentially within tray 82. A forward slot 92 is formed in base 90 to permit ejection of devices 10 from tray 82 over receiving sockets in a support. As shown in FIG. 11, alignment or registration features are preferably formed on base 90 to ensure proper alignment of slot 92 over a receiving socket. In the illustrated embodiment, such features include registration pins 94 disposed laterally adjacent to slot 92.

Various configurations of actuators may be envisaged for dispensing individual devices 10 from tray 82. In the illustrated embodiment, actuator 84 includes an upper panel 96 and a contiguous ejector panel 98. Upper panel 96 may be depressed under manual power to urge ejector panel 98 into contact with an individual device 10 to eject the device through slot 92.

As best illustrated in FIG. 12, installation of devices 10 proceeds by first loading the devices within the dispenser in a stacked arrangement. A sliding plate or backstop 100 contacts the devices to hold them in engagement and to urge them sequentially toward slot 92. In the illustrated embodiment, a compression spring 102 disposed about a telescoping rod structure (not shown) serves to maintain a compressive force urging the devices toward slot 92. Actuator 84 is retained above tray 82, such as by means of a hinge or pivot pin 104. A biasing spring (not shown) may be provided to maintain actuator 84 in a raised or biased position as illustrated in FIG. 12.

Once dispenser 80 is properly positioned over a socket 40 formed in a support 30, the individual device overlying slot 92 may be installed. As shown in FIGS. 12 and 13, ejector panel 98 includes a lower edge 108 designed to contact a device 10 and to urge it through slot 92 and into support 30. Thus, upon depression of actuator 84 under manual force, as indicated at arrow 110 in FIG. 13, a single device 10 is slid from tray 82 and guided into engagement with socket 40 and electrical socket 44 at the base thereof The actuator may then be raised, the dispenser displaced, and a subsequent device installed. Sliding plate 100, in combination with compression spring 102 ensures that a subsequent device is indexed into place above slot 92 for such subsequent installation.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method for installing at least one electronic device of a plurality of electronic devices in a support, the at least one electronic device having first conductive elements configured to contact second conductive elements in an interface region of the support, the method comprising:
providing a dispenser with an electronic device holding tray, the dispenser retaining the plurality of electronic devices aligned within the tray and supported by a base;
locating the base on the interface region of the support; and
activating an actuator to eject the at least one electronic device from the tray through an opening in the base onto the interface region to bring the first conductive elements into contact with the second conductive elements.

2. The method of claim 1, comprising inserting the plurality of electronic devices into the tray and aligning the devices within the tray using sidewalls of the tray and the base, wherein the opening comprises a slot within the base for guiding the electronic device through the dispenser into the support.

3. The method of claim 2, comprising biasing the plurality of electronic devices in a stack within the tray towards the slot with a compression spring.

4. The method of claim 2, wherein activating the actuator comprises inserting the actuator through the slot.

5. The method of claim 1, comprising advancing a second electronic device of the plurality of electronic devices into an installation position within the tray.

6. The method of claim 5, comprising ensuring proper alignment of the installation position with the interface region by aligning registration elements disposed on the dispenser and on the support, wherein the installation position is located over the opening.

7. The method of claim 1, comprising positioning the at least one electronic device within a socket of the support to form an electrical interface with a circuit board, wherein the support is electrically interfaced with the circuit board and the support includes an insulative body with sidewalls and partitions defining the socket.

\* \* \* \* \*

UNITED STATES PATENT AND TRADEMARK OFFICE
CERTIFICATE OF CORRECTION

PATENT NO. : 7,600,314 B2  Page 1 of 1
APPLICATION NO. : 11/218995
DATED : October 13, 2009
INVENTOR(S) : Kinsman et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 341 days.

Signed and Sealed this

Fifth Day of October, 2010

David J. Kappos
*Director of the United States Patent and Trademark Office*